United States Patent [19]
Miura et al.

[11] Patent Number: 5,756,374
[45] Date of Patent: May 26, 1998

[54] COMPOUND SEMICONDUCTOR LIGHT EMITTING DEVICE AND METHOD OF PREPARING THE SAME

[75] Inventors: Yoshiki Miura; Hideki Matsubara; Masato Matsushima, all of Hyogo; Hisashi Seki; Akinori Koukitu, both of Tokyo, all of Japan

[73] Assignee: Sumitomo Electric Industries, Ltd., Osaka, Japan

[21] Appl. No.: 856,911

[22] Filed: May 15, 1997

Related U.S. Application Data

[62] Division of Ser. No. 614,837, Mar. 7, 1996, Pat. No. 5,665,986.

[30] Foreign Application Priority Data

Mar. 27, 1995 [JP] Japan ..... 7-68047
Mar. 27, 1995 [JP] Japan ..... 7-68051

[51] Int. Cl.$^6$ ............. H01L 21/00; H01L 21/20; H01L 21/36; C30B 23/00
[52] U.S. Cl. ............. 438/46; 438/478; 438/925; 117/84
[58] Field of Search ............. 438/46, 925, 478

[56] References Cited

U.S. PATENT DOCUMENTS

| | | |
|---|---|---|
| 5,218,216 | 6/1993 | Manabe et al. |
| 5,278,433 | 1/1994 | Manabe et al. |
| 5,281,830 | 1/1994 | Kotaki et al. |
| 5,369,289 | 11/1994 | Tamaki et al. |
| 5,400,740 | 3/1995 | Goto et al. ..... 117/91 |
| 5,523,589 | 6/1996 | Edmond et al. |
| 5,578,839 | 11/1996 | Nakamura et al. |

OTHER PUBLICATIONS

Nikkei Science, Oct. 1994, pp. 44–55.

K. Onabe "Study on Mechanism of Cubic Structural Transformation Heteroepitaxy of Nitride Compound Semiconductors" Nihon Kessho Seicho Gakkai-Shi, vol. 21, No. 5 (1994) Supplement S409–S414 Abstract only.

H. Tsuchiya et al. "Homoepitaxial Growth of Cubic GaN by Hydride Vapor Phase Epitaxy on Cubic GaN/GaAs Substrates Prepared with Gas Source Molecular Beam Epitaxy", Jpn. J. Appl. Phys. vol. 33 (1994) pp. 1747–1752.

S. Nakamura et al. "Candela–class high–brightness InGaN/AlGaN double–heterostructure blue–light–emitting diodes" Appl. Phys. Lett. 64 (1994), pp. 1687–1689.

*Primary Examiner*—Brian Dutton
*Attorney, Agent, or Firm*—W. G. Fasse; W. F. Fasse

[57] ABSTRACT

A compound semiconductor light emitting device of high performance and a method which can industrially prepare the same are provided. The compound semiconductor light emitting device includes a GaAs substrate, a buffer layer consisting of GaN, having a thickness of 10 nm to 80 nm, which is formed on the substrate, an epitaxial layer consisting of $Al_xGa_{1-x}N (0 \leq x < 1)$ which is formed on the buffer layer, an incommensurate plane which is located on the interface between the buffer layer and the epitaxial layer, a light emitting layer which is formed on the epitaxial layer, and a cladding layer which is formed on the light emitting layer. The buffer layer is formed by organic metal chloride vapor phase epitaxy at a first temperature, while the epitaxial layer is formed by organic metal chloride vapor phase epitaxy at a second temperature which is higher than the first temperature. The light emitting layer preferably consists of $In_yGa_{1-y}N$ ($0<y<1$) which is doped with Mg.

9 Claims, 4 Drawing Sheets

COMPOUND SEMICONDUCTOR LIGHT EMITTING DEVICE AND METHOD OF PREPARING THE SAME

CROSS-REFERENCE TO RELATED APPLICATION

This application is a divisional of our application U.S. Ser. No. 08/614,837, filed on Mar. 7, 1996, now U.S. Pat. No. 5,665,986.

BACKGROUND OF THE INVENTION

1. Field of the Invention

The present invention relates to a compound semiconductor light emitting device and a method of preparing the same, and more particularly, it relates to a GaN compound semiconductor light emitting device employing a substrate of GaAs, GaP, InAs or InP and a method of preparing the same.

2. Description of the Background Art

FIG. 5 is a sectional view showing the structure of a blue and green light emitting device (LED) employing a sapphire substrate, described in Nikkei Science, October 1994, P. 44, for example, which is now on the market.

Referring to FIG. 5, a clad or cladding layer 14, a light emitting layer 15, a clad or cladding layer 16 and a GaN epitaxial layer 17 are successively formed on an epitaxial wafer which is formed by a sapphire substrate 11, a gallium nitride (GaN) buffer layer 12 formed on the substrate 11, and a hexagonal GaN epitaxial layer 13 formed on the GaN buffer layer 12 in this blue and green light emitting device, while ohmic electrodes 18 and 19 are formed on the GaN epitaxial layers 13 and 17 respectively. In this blue and green light emitting device, the GaN buffer layer 12 is adapted to relax distortion resulting from the difference between lattice constants of the sapphire substrate 1 and the GaN epitaxial layer 13.

Referring to FIG. 5, this blue and green light emitting device employs insulating sapphire as the material for the substrate 11, and hence two types of electrodes must be formed on the same surface side while preparing the device. Thus, patterning by photolithography must be performed at least twice and the nitride layer must be etched by reactive ion etching, which thus requires complicated steps. Further, the substrate is hard to treat in element isolation, due to the hardness of sapphire. Regarding possible applications of the light emitting device, further, the sapphire substrate is disadvantageously inapplicable to a laser diode having an optical resonator defined by a cleavage plane, since sapphire is uncleavable.

In a conventional growth method, on the other hand, the growth temperature is so high that growth of a high In composition ratio cannot be attained in an InGaN layer which is an active layer, and hence a blue-green light emitting device is hard to prepare. Further, it is inevitably necessary to introduce zinc (zn) as an emission center which leads to technical problems in application as a device since the emission wavelength is broad and the performance in a full color display is deteriorated.

To this end, an attempt has been made to employ conductive GaAs as the material for the substrate in place of sapphire having the aforementioned disadvantages. When the substrate is prepared from GaAs, however, an epitaxial wafer which rivals that employing the sapphire substrate cannot be obtained under conditions similar to those for the case of employing the sapphire substrate.

In relation to preparation of an epitaxial wafer with a GaAs substrate, therefore, various studies have been made in the art.

Among these studies, Nihon Kessho Seicho Gakkai-Shi Vol. 21, No. 5 (1994), Supplement S409 to S414 (hereinafter referred to as "literature 1"), for example, discloses an epitaxial wafer shown in FIG. 6.

Referring to FIG. 6, this epitaxial wafer comprises a GaAs substrate 21, a GaAs buffer layer 22 which is formed on the substrate 21, a GaN coating 23 which is obtained by nitriding a surface of the GaAs buffer layer 22 thereby replacing arsenic (As) with nitrogen (N), and a GaN epitaxial layer 24 which is formed on the GaN coating 23.

In preparing this epitaxial wafer, the GaN epitaxial layer 24 is formed by OMVPE (organic metal vapor phase epitaxy). This OMVPE method is adapted to grow a GaN epitaxial layer on a substrate in a vapor phase by introducing a first gas including trimethylgallium (TMGca) and a second gas including ammonia ($NH_3$) into a reaction chamber while heating only the substrate in the reaction chamber by high-frequency heating.

On the other hand, Jpn. J. Appl. Phys. Vol. 33 (1994) pp. 1747–1752 (hereinafter referred to as "literature 2"), for example, discloses an epitaxial wafer shown in FIG. 7.

Referring to FIG. 7, a cubic GaN epitaxial layer 33 is formed on a substrate 31 which is previously provided on its surface with a cubic GaN buffer layer 32 by GS-MBE (gas source molecular beam epitaxy).

In preparing of the epitaxial wafer, the GaN epitaxial layer 33 is formed by hydride VPE (vapor phase epitaxy). This hydride VPE involve setting a substrate and a source boat containing Ga metal in a reaction chamber and to introduce a first gas including hydrogen chloride (HCl) and a second gas including ammonia ($NH_3$) into the reaction chamber while heating the overall reaction chamber with a resistance heater from the exterior, thereby growing a GaN epitaxial layer on the substrate in a vapor phase.

In the above cited epitaxial wafer disclosed in literature 1, however, the GaN epitaxial layer is grown by OMVPE, as described above. When the GaN epitaxial layer is grown on the GaAs substrate by the OMVPE, film growth rate is extremely reduced as compared with the case of growing the layer on a sapphire substrate. In more concrete terms, the film forming rate for forming a film on a GaAs substrate is reduced to about 0.15 μm/h., although a film forming rate of about 3 μm/h. is attained in the case of forming a film on a sapphire substrate under the same conditions. Therefore, since a GaN epitaxial layer of about 4 μm in thickness must be formed in order to apply the epitaxial wafer to a light emitting device, for example, almost one day is required for preparing the layer by this method. Thus, preparation of an epitaxial wafer by this method is unsuitable for industrialization, due to incapability of cost reduction.

According to this method, further, the treatment temperature cannot be much increased for growing the GaN epitaxial layer. Therefore, improvement of the characteristics of the obtained GaN epitaxial layer is limited.

In OMVPE, further, the ammonia is not sufficiently decomposed due to the so-called cold wall method of heating only the substrate in the reaction chamber. Thus, it is necessary to increase the supply quantity of ammonia in order to compensate for the incomplete decomposition thereof, leading to a high V/III ratio (the ratio of a group V raw material to a group III raw material) of raw material supply.

According to Appl. Phys. Lett. 64 (1994), p. 1687, for example, it is calculated from the values of quantities of raw material introduction in growth that the V/III ratio in GaN growth on a sapphire substrate is up to $6.0 \times 10^3$ and that it is up to $1.1 \times 10^4$ in GaInN growth. Thus, OMVPE leads to enormous raw material consumption, and hence an epitaxial wafer cannot be prepared at a low cost.

According to OMVPE, further, the epitaxy is carried out at a high temperature of at least 800° C., in order to facilitate decomposition of the ammonia which is employed as the group V raw material. When the growth rate is thus increased, however, a GaInN layer of high In composition is difficult to form, as described above.

In the epitaxial wafer disclosed in the above cited literature 2, on the other hand, a substrate which is previously provided on its surface with a GaN buffer by GS-MBE must be prepared, in order to form a GaN epitaxial layer. In this case, the growth rate is so slow that formation of the GaN buffer layer on the GaAs substrate by GS-MBE is unsuitable for industrialization.

In employing hydride VPE, further, hetero growth requiring a plurality of sources as well as growth of a number of layers are so difficult that this method is unsuitable for practical utilization.. In addition, two reaction chambers are required for preparing an epitaxial wafer by this method, since a buffer layer and an epitaxial layer are grown by different processes, and hence surface contamination caused by interruption of growth may disadvantageously come into question.

In the above cited literature 2, further, preparation conditions etc. for obtaining a GaN epitaxial layer of high quality/characteristics have not been studied in particular.

SUMMARY OF THE INVENTION

An object of the present invention is to provide a compound semiconductor light emitting device of high performance solving the aforementioned problems, and a method which can industrially prepare the same.

According to an aspect of the present invention, a compound semiconductor light emitting device is provided.

This compound semiconductor light emitting device such as a light emitting diode includes a substrate of a compound semiconductor which is selected from a group consisting of GaAs, GaP, InAs and InP, a buffer layer consisting of GaN, having a thickness of 10 nm to 80 nm, which is formed on the substrate, an epitaxial layer consisting of $Al_xGa_{1-x}N$ ($0 \leq x < 1$) which is formed on the buffer layer, an incommensurate plane which is located on the interface between the buffer layer and the epitaxial layer, a light emitting layer which is formed on the epitaxial layer, and a clad or cladding layer which is formed on the light emitting layer.

The incommensurate plane which is located on the interface between the buffer layer and the epitaxial layer may conceivably result from a deviation of the respective crystal lattices caused by the difference between the growth temperatures of the buffer layer and the epitaxial layer, for example. This incommensurate plane can be observed as the difference in contrast between the buffer layer and the epitaxial layer through sectional observation with a transmission electron microscope.

In the compound semiconductor light emitting device, preferably the epitaxial layer consists of $Al_xGa_{1-x}N$ ($0 \leq x < 1$) having a first conductivity type, the light emitting layer consists of $In_yGa_{1-y}N$ ($0 < y < 1$), and the clad or cladding layer consists of $Al_zGa_{1-z}N$ ($0 \leq z < 1$) having a second conductivity type which is different from the first conductivity type.

When the light emitting layer consisting of $In_yGa_{1-y}N$ is not doped with an emission center such as Zn, band-edge emission of luminescent colors of violet, blue, green and yellow, i.e., sharp emission spectra, are obtained in the ranges of $0 < y < 0.4$, $0.4 < y < 0.7$, $0.7 < y < 0.9$ and $0.9 < y < 1$ respectively.

Preferably, the light emitting layer consisting of $In_yGa_{1-y}N$ is doped with Mg. Further preferably, the thickness of the buffer layer is 20 nm to 60 nm in the compound semiconductor light emitting device.

According to another aspect of the present invention, a method of preparing a compound semiconductor light emitting device is provided. This method comprises the steps of forming a buffer layer consisting of GaN on a substrate of a compound semiconductor which is selected from a group consisting of GaAs, GaP, InAs and InP at a first temperature by a method of introducing a first gas including an organic metal raw material containing hydrogen chloride and gallium and a second gas including ammonia into a reaction chamber while heating the overall reaction chamber from the exterior for carrying out vapor phase epitaxy on the substrate which is set in the reaction chamber, forming an epitaxial layer consisting of $Al_xGa_{1-x}N$ ($0 \leq x < 1$) on the buffer layer at a second temperature which is higher than the first temperature by the method of introducing a first gas including an organic metal raw material containing hydrogen chloride and gallium and a second gas including ammonia into the reaction chamber while heating the overall reaction chamber from the exterior for making vapor phase epitaxy on the substrate which is set in the reaction chamber, forming a light emitting layer on the epitaxial layer, and forming a clad layer on the light emitting layer.

The organic metal raw material containing gallium is prepared from trimethylgallium or triethylgallium, for example.

In the method of preparing a compound semiconductor light emitting device, preferably the epitaxial layer consists of $Al_xGa_{1-x}N$ ($0 \leq x < 1$) having a first conductivity type, the light emitting layer consists of $In_yGa_{1-y}N$ ($0 < y < 1$), and the clad layer consists of $Al_zGa_{1-z}N$ ($0 \leq z < 1$) having a second conductivity type which is different from the first conductivity type.

Preferably, the light emitting layer consisting of $In_yGa_{1-y}N$ is doped with Mg. Further preferably, the first temperature is 300° C. to 700° C. and the second temperature is at least 750° C. in the method of preparing a compound semiconductor light emitting device. More preferably, the first temperature is 400° C. to 600° C.

The compound semiconductor light emitting device according to the present invention has a buffer layer consisting of GaN having a thickness of 10 nm to 80 nm.

While the conventional blue and green light emitting device employing a sapphire substrate is also provided with a buffer layer consisting of GaN, this buffer layer is mainly adapted to relax distortion caused by the difference between the lattice constants of the sapphire substrate and the GaN epitaxial layer. On the other hand, the buffer layer provided in the present invention also serves as a heat-resistant coating, in addition to the function of relaxing distortion.

While GaN must be epitaxially grown at an extremely high temperature of 800° C. to 1100° C. in general, GaN and the sapphire substrate are not thermally damaged by such a high temperature exceeding 800° C. However, a substrate of GaAs, GaP, InAs or InP cannot serve as a substrate at a high temperature exceeding 800° C., since As or P would be lost as such a temperature. In order to form a GaN epitaxial layer on a substrate of GaAs, GaP, InAs or InP, therefore, it is necessary to provide a heat-resistant coating. According to the present invention, the GaN buffer layer which is formed at lower temperature than the GaN epitaxial layer serves as such a heat-resistant coating.

The thickness of this GaN buffer layer is 10 nm to 80 nm. If the thickness is smaller than 10 nm, the buffer layer is partially broken during the temperature increase for forming the epitaxial layer, which inevitably leads to separation of the epitaxial layer which is formed thereon. If the thickness is larger than 80 nm, on the other hand, nuclear growth is mixed into low-temperature growth of a flat buffer layer, to disadvantageously grow the epitaxial layer in the form of a pyramid about such nucleus.

According to the present invention, band-edge emission can be implemented when the light emitting layer consists of $In_yGa_{1-y}N$ (0<y<1) which is doped with Mg.

In the conventional blue and green light emitting device, the emission wavelength is broad since blue emission is attained by introducing a deep center of Zn as an emission center. According to the present invention, on the other hand, formation of a GaInN layer of high In composition is enabled by employing a substrate of GaAs, GaP, InAs or InP. Consequently, band-edge emission having a sharp emission wavelength can be implemented by Mg doping, thereby enabling wide-ranging application to a laser diode and the like.

According to the inventive method of preparing a compound semiconductor light emitting device, the GaN buffer layer is formed on the substrate of the compound semiconductor which is selected from the group consisting of GaAs, GaP, InAs and InP at a temperature lower than the growth temperature of the GaN epitaxial layer.

Therefore, a cubic GaN epitaxial layer of high quality can be grown with no damage on the substrate crystals.

The temperature for forming the buffer layer consisting of GaN is preferably 300° C. to 700° C. If the temperature is lower than 300° C., then a buffer layer consisting of GaN would not be grown. If the temperature is higher than 700° C., on the other hand, then the substrate would be thermally damaged to disadvantageously separate the epitaxial layer which is formed thereon.

According to the present invention, the GaN buffer layer and the GaN epitaxial layer are formed by using a method (hereinafter referred to as "organic metal chloride vapor phase epitaxy") of introducing a first gas including an organic metal raw material containing hydrogen chloride and gallium and a second gas including ammonia into the reaction chamber while heating the overall reaction chamber from the exterior for causing and carrying out vapor phase epitaxy on the substrate which is set in the reaction chamber. This organic metal chloride vapor phase epitaxy is carried out at a high growth rate, and can obtain a steep hetero interface.

According to the present invention, further, the buffer layer and the epitaxial layer are formed by the same organic metal chloride vapor phase epitaxy. Thus, these layers can be consistently formed in the same chamber.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (Example 1)

Figure 1:
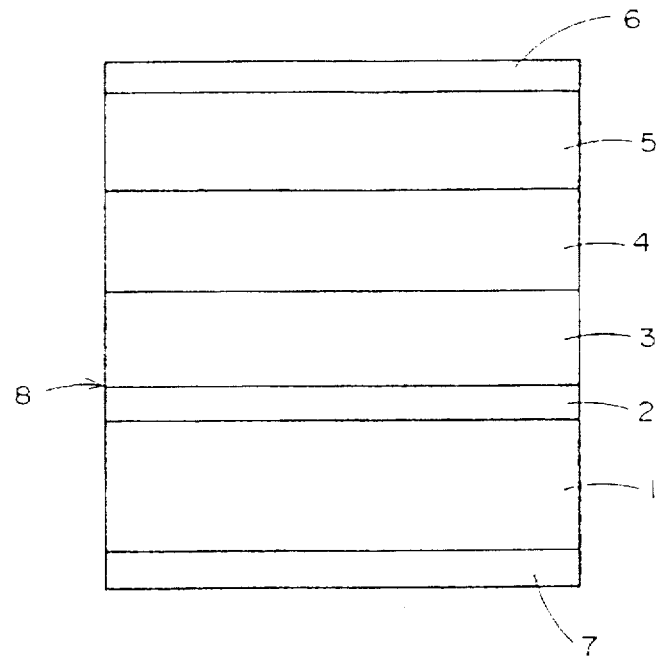
FIG. 1 is a sectional view showing an exemplary structure of a compound semiconductor light emitting device according to the present invention.

FIG. 1 is a sectional view showing an exemplary structure of a compound semiconductor light emitting device according to the present invention.

Referring to FIG. 1, a light emitting layer 4 consisting of $In_{0.2}Ga_{0.8}N$ and a cladding or clad layer 5 consisting of p-type GaN are successively formed on an epitaxial wafer formed by a Gays substrate 1, a buffer layer 2 consisting of GaN which is formed on the substrate 1, and an epitaxial layer 3 consisting of cubic in-type GaN which is formed on the buffer layer 2 in this blue light emitting device. Electrodes 6 and 7 are respectively formed on an upper part of the clad layer 5 and a rear surface of the substrate 1, i.e. a surface of the substrate 1 opposite the buffer layer 2. As shown in FIG. 1, the several layers are full-width layers extending entirely across a common width of the device, without requiring selectively etched or selectively grown layers for providing the electrodes 6 and 7. Further, an incommensurate plane 8 is located on the interface between the buffer layer 2 and the epitaxial layer 3.

A method of preparing the blue light emitting device having the aforementioned structure is now described.

Figure 2:
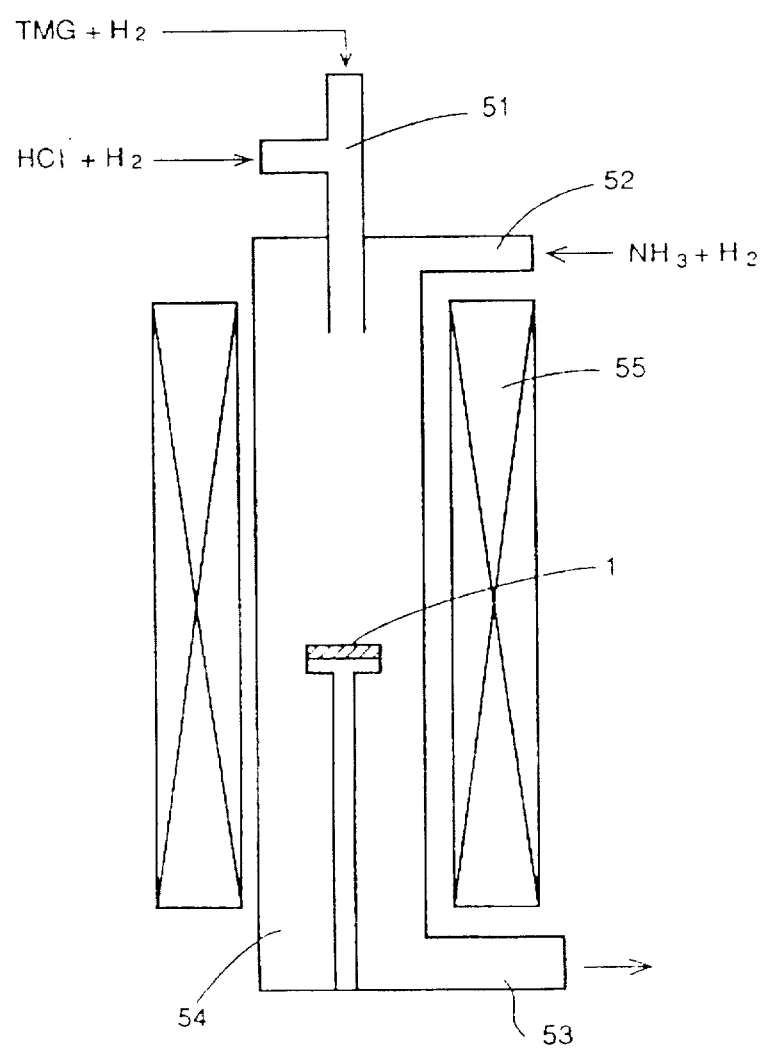
FIG. 2 schematically illustrates the structure of a vapor phase epitaxy device employed for preparing a compound semiconductor light emitting device through organic metal chloride vapor phase epitaxy according to the present invention.

FIG. 2 schematically illustrates the structure of a vapor phase epitaxy device which is employed for preparing an epitaxial wafer through organic metal chloride vapor phase epitaxy according to the present invention. Referring to FIG. 2, this device is formed by a reaction chamber 54 having first and second gas inlet ports 51 and 52 and an exhaust port 53, and a resistance heater 55 for heating the overall reaction chamber 54 from the exterior.

Using the apparatus having the aforementioned structure as shown in FIG. 2, a blue light emitting device was prepared in the following manner:

Referring to FIG. 2, a gallium arsenide (GaAs) (100) plane substrate 1 which was pretreated with an ordinary $H_2SO_4$ etching solution was first set in the reaction chamber 54, which is made of quartz.

Then, the overall reaction chamber 54 was heated with the resistance heater 55 from the exterior to maintain the substrate 1 at a temperature of 500° C., trimethylgallium (TMGa) and hydrogen chloride (HCl) were introduced as group III raw materials from the first gas inlet port 51 at partial pressures of $8 \times 10^{-4}$ atm. and $8 \times 10^{-4}$ atm. respectively, while introducing ammonia gas ($NH_3$) as a group V raw material from the second gas inlet port 52 at a partial pressure of $1.6 \times 10^{-1}$ atm. Under such conditions, epitaxy was carried out for 15 minutes, thereby forming a buffer layer 2 consisting of in-type GaN having a thickness of 30 nm. Due to such interposition of the buffer layer 2, it was possible to remarkably improve the crystallinity of an epitaxial layer which was next formed thereon as described in the following.

Namely, the temperature of the substrate 1 which was provided with the buffer layer 2 consisting of in-type GaN was next increased by the resistance heater 55 to 750° C. to 800° C., and thereafter epitaxy was carried out for 60 minutes under such conditions that partial pressures of TMGa, HCl and $NH_3$ were $8 \times 10^{-4}$ atm., $8 \times 10^{-4}$ atm. and $1.6 \times 10^{-1}$ atm. respectively. Consequently, a mirror-faced in-type GaN epitaxial layer 3 of 2 μm in thickness was formed on the buffer layer 2.

Then, the temperature of the substrate 1 which was provided with the buffer layer 2 and the epitaxial layer 3 was reduced to the range of 500° C. to 700° C. by the resistance heater 55, and TMGa, trimethylindium (TMIn), HCl and $NH_3$ were introduced under such conditions that the partial pressure of TMiN was 10 times that of TMGa, and epitaxy was carried out for 10 minutes. Consequently, a light emitting layer 4 consisting of $In_{0.2}Ga_{0.8}N$ was formed on the epitaxial layer 3.

Then, the conditions were returned to those for forming the epitaxial layer 3 consisting of in-type GaN, and a clad layer 5 consisting of p-type GaN was formed in a similar manner to the above.

The dopant for the in-type GaN layer was prepared from Si or S, and that for the p-type GaN layer was prepared from Mg. Further, the dopant for the in-type InGaN layer was prepared from Si or S, and that for the p-type InGaN layer was prepared from Zn.

Then, electrodes 6 and 7 were formed on the clad layer 5 and on the rear surface of the substrate 1 respectively, thereby completing a blue light emitting device.

It was confirmed that the blue light emitting device obtained in the aforementioned manner exhibits high performance.

When the partial pressure of TMIn was adjusted to be 20 times that of TMGa, a light emitting layer 4 consisting of $In_{0.5}Ga_{0.5}N$ was formed under the same conditions. The light emitting layer was not doped. Consequently, a blue light emitting device having superior wavelength purity to the aforementioned device provided with the light emitting layer of $In_{0.2}Ga_{0.8}N$ was obtained.

When the partial pressure of TMIn was adjusted to be 50 times that of TMGa and the substrate temperature was adjusted in the range of 450° C. to 650° C., a light emitting layer 4 consisting of $In_{0.8}Ga_{0.2}N$ was formed under the same conditions. $In_{0.8}Ga_{0.2}N$ was not doped. Consequently, a green light emitting device having excellent wavelength purity was obtained.

(Example 2)

Absolutely similarly to Example 1, a buffer layer 2 consisting of in-type GaN having a thickness of 30 nm was formed on a GaAs (100) plane substrate 1.

Then, the temperature of the substrate 1 provided with the buffer layer 2 was increased in the range of 800° C. to 850° C. by the resistance heater 55, and thereafter TMGa, trimethylaluminum (TMAl), HCl and $NH_3$ were introduced so that TMGa and TMAl were at equal partial pressure ratios to each other, for carrying out epitaxy for 10 minutes.

Consequently, an epitaxial layer 3 consisting of in-type $Al_{0.1}Ga_{0.9}N$ was formed on the buffer layer 2.

Then, the temperature of the substrate 1 provided with the buffer layer 2 and the epitaxial layer 3 was reduced in the range of 500° C. to 700° C. by the resistance heater 55, and thereafter TMGa, TMIn, HCl and $NH_3$ were introduced so that the partial pressure of TMIn was 10 times that of TMGa, for making epitaxy for 10 minutes.

Consequently, a light emitting layer 4 consisting of $In_{0.2}Ga_{0.8}N$ was formed on the epitaxial layer 3.

Then, the conditions were returned to those for forming the epitaxial layer 3 consisting of in-type $Al_{0.1}Ga_{0.9}N$, and a clad layer 5 consisting of p-type $Al_{0.1}Ga_{0.9}N$ was formed in a similar manner to the above.

The dopant for the in-type AlGaN layer was prepared from Si or S, and that for the p-type AlGaN layer was prepared from Mg. Further, the dopant for the in-type InGaN layer was prepared from Si or S, and that for the p-type InGaN layer was prepared from Zn.

Then, electrodes 6 and 7 were formed on the clad layer 5 and on the rear surface of the substrate 1 respectively, thereby completing a blue light emitting device.

It was confirmed that the blue light emitting device obtained in the aforementioned manner exhibits high performance.

When the partial pressure of TMIn was adjusted to be 20 times that of TMGa, a light emitting layer 4 consisting of $In_{0.5}Ga_{0.5}N$ was formed under the same conditions. The light emitting layer was not doped. Consequently, a blue light emitting device having superior wavelength purity to the device provided with the light emitting layer of $In_{0.2}Ga_{0.8}N$ was obtained.

When the partial pressure of TMIn was adjusted to be 50 times that of TMGa and the substrate temperature was adjusted in the range of 450° C. to 650° C., a light emitting layer 4 consisting of $In_{0.8}Ga_{0.2}N$ was formed under the same conditions. $In_{0.8}Ga_{0.2}N$ was not doped. Consequently, a green light emitting device having excellent wavelength purity was obtained.

(Comparative Example 1)

In order to examine the difference between characteristics of epitaxial layers consisting of $Al_xGa_{1-x}N$ ($0 \leq x < 1$) resulting from the respective presence or absence of buffer layers consisting of GaN, an epitaxial layer consisting of $Al_xGa_{1-x}N$ ($0 \leq x < 1$) was directly grown on a GaAs substrate, under growth conditions similar to those of Example 1.

Consequently, it was observed that the surface of the GaAs substrate was damaged by a high temperature and irregularized such that the epitaxial layer formed thereon was separated from the substrate when no buffer layer consisting of GaN was provided there between.

In order to compare the different characteristics resulting from the respective presence or absence of the buffer layers with each other, results of measurement of irregularities on $Al_xGa_{1-x}N$ epitaxial layers with a surface roughness meter, X-ray diffraction and PL measurement were compared with each other as to the epitaxial wafers obtained in Example 1 and comparative example 1.

Consequently, a remarkable difference was observed as to the irregularities of the epitaxial layer surfaces, and it has been recognized that the surface homology is remarkably improved due to provision of the buffer layer consisting of GaN. Also as to the results of X-ray diffraction and PL measurement, extremely sharp peaks were observed only as to Example provided with the buffer layer.

(Example 3)

In order to study the optimum thickness of the GaN buffer layer, GaN buffer layers of various thicknesses were formed on GaAs substrates, and GaN epitaxial layers were grown thereon for there measuring characteristics of the obtained GaN epitaxial layers.

The GaN buffer layers and the GaN epitaxial layers were grown under conditions similar to those of Example 1.

Figure 3:
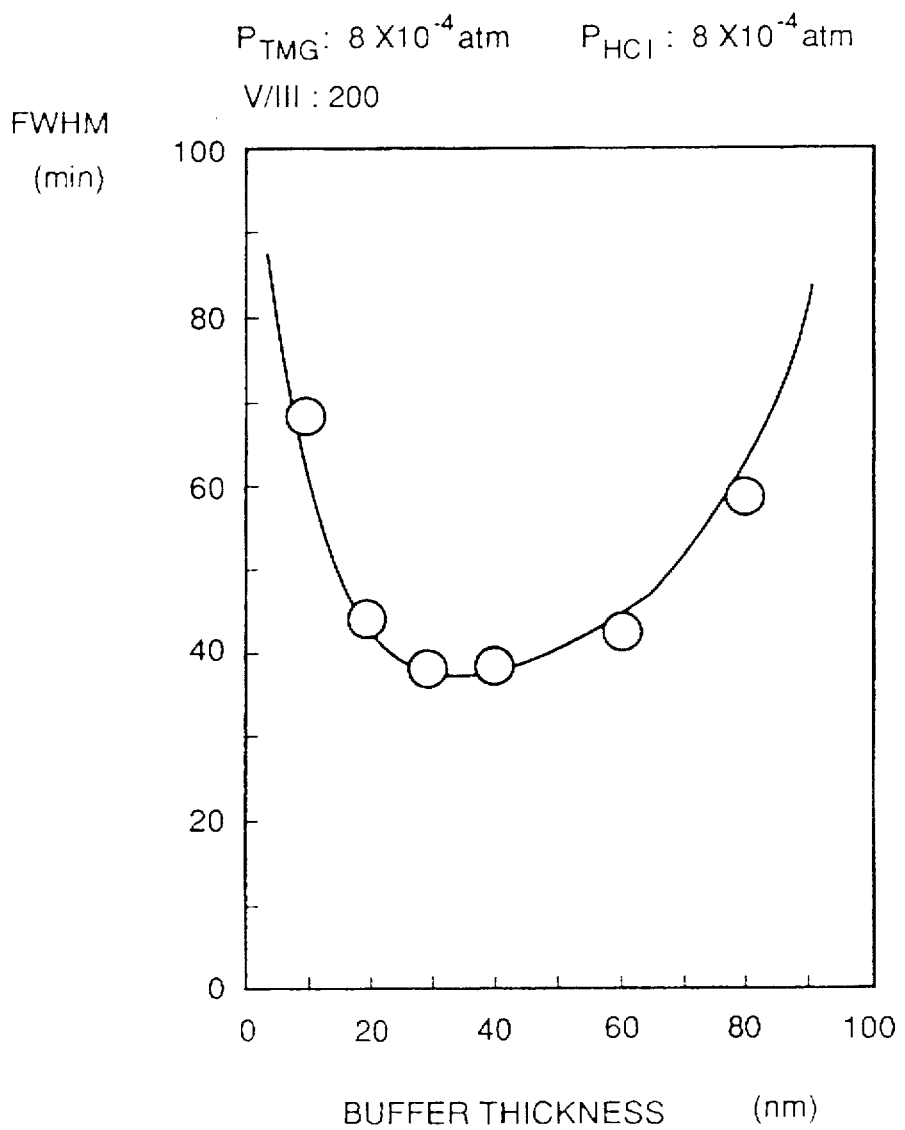
FIG. 3 illustrates the relations between the thicknesses of GaN buffer layers and full width half maximums (FWHM) of X-ray peaks of GaN epitaxial layers.

FIG. 3 illustrates the relations between the thicknesses of the GaN buffer layers and full width half maximums (FWHM) of X-ray peaks of the GaN epitaxial layers. Referring to FIG. 3, the axis of abscissas shows the thicknesses (nm) of the GaN buffer layers, and the axis of ordinates shows the full width half maximums (FWHM) (min.) of the X-ray peaks.

Figure 4:
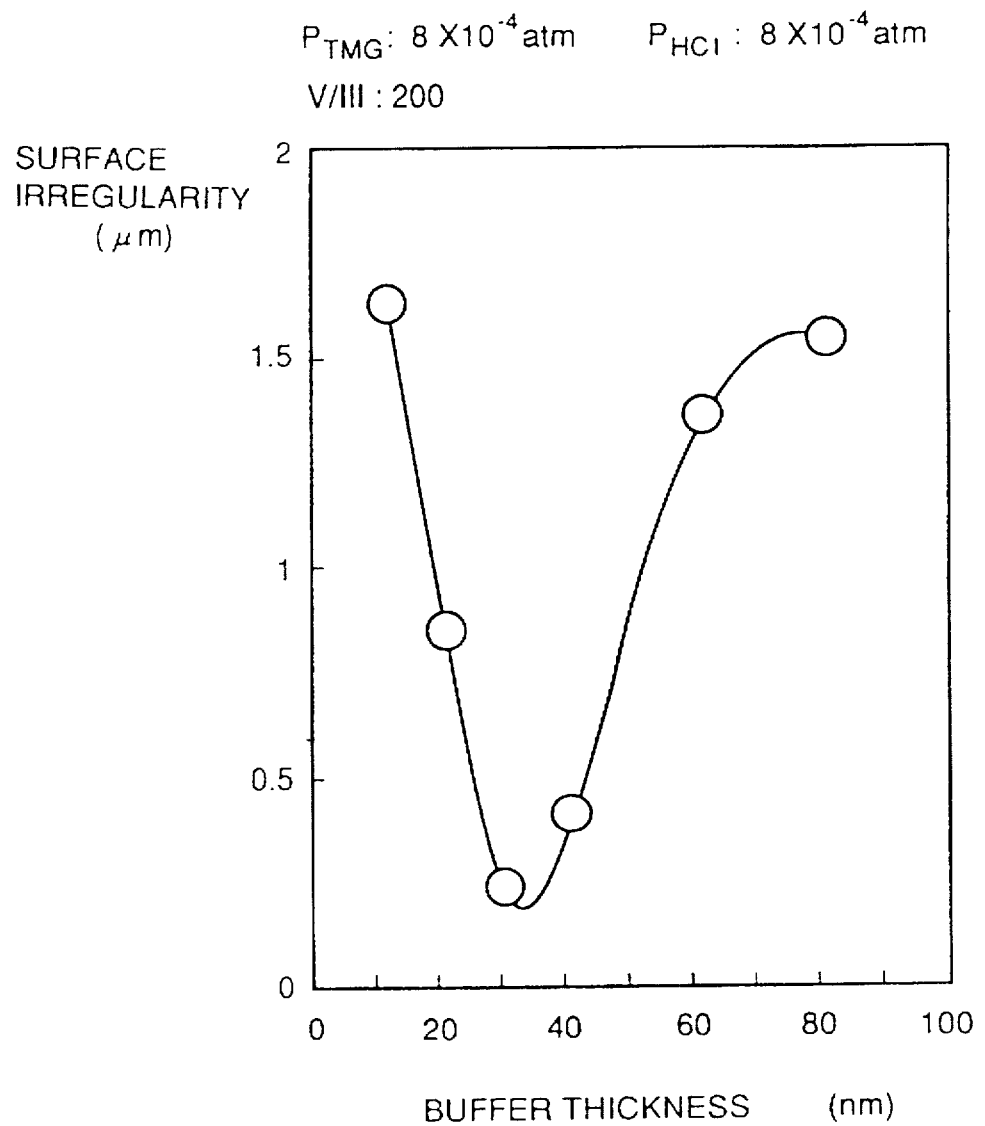
FIG. 4 illustrates the relations between the thicknesses of the GaN buffer layers and surface irregularities of the GaN epitaxial layers.
Figure 5:
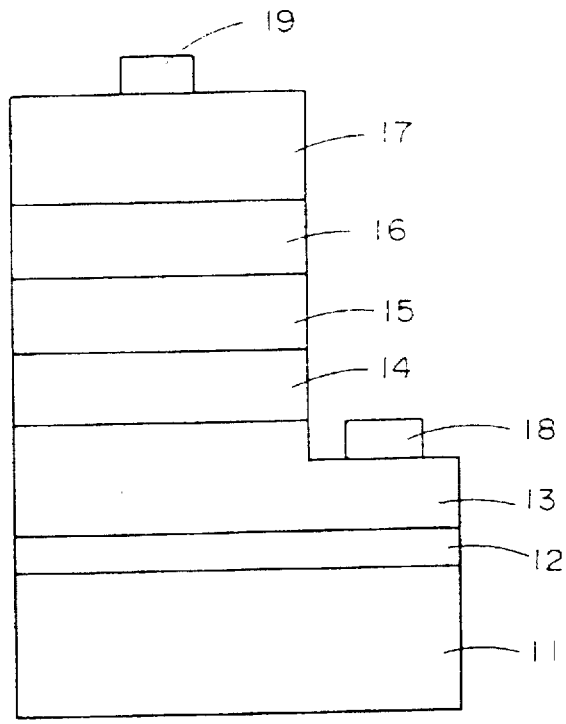
FIG. 5 is a sectional view showing an exemplary structure of a conventional blue and green light emitting device.
Figure 6:
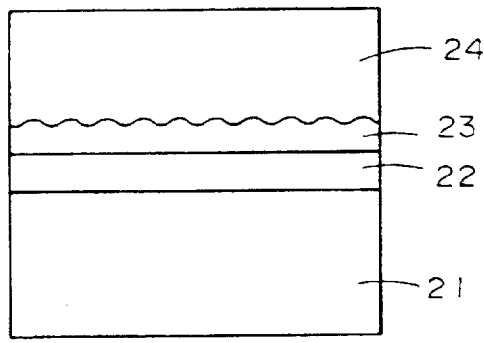
FIG. 6 is a sectional view showing an exemplary structure of a conventional epitaxial wafer.
Figure 7:
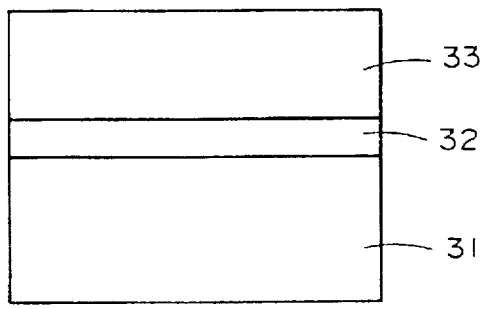
FIG. 7 is a sectional view showing another exemplary structure of the conventional epitaxial wafer.

FIG. 4 illustrates the relations between the thicknesses of the GaN buffer layers and the surface irregularities of the GaN epitaxial layers. Referring to FIG. 4, the axis of abscissas shows the thicknesses (nm) of the GaN buffer layers, and the axis of ordinates shows the surface irregularities (μm). The surface irregularities are defined by the differences between uppermost points of convex portions and lowermost points of concave portions.

It is clearly understood from FIGS. 3 and 4 that crystallinity of the GaN epitaxial layer which is grown on the buffer layer is disadvantageously reduced and surface irregularities and increased if the thickness of the buffer layer is too small or too large. Thus, it is understood that the thickness of the GaN buffer layer is preferably 10 nm to 80 nm, and more preferably 20 nm to 60 nm, in which case the FWHM value is less than about 45 min. and the surface irregularity is less than about 1.3 μm and especially less than about 0.9 μm.

It has been confirmed that a similar effect is attained also when a GaP, InAs or InP substrate is employed in place of the GaAs substrate.

It has also been confirmed that a similar effect is attained also when triethylgallium (TEGa) is employed as the group III raw material in place of TMGa.

(Example 4)

A compound semiconductor light emitting device was prepared similarly to Example 1, by employing Mg as a dopant for an InGaN layer in place of Si, S or Zn. Other preparation conditions were absolutely similar to those of Example 1, and hence a redundant description is omitted here.

Consequently, a violet light emitting device having a light emitting layer consisting of $In_yGa_{1-y}N$ (0<y<1) which was doped with Mg was completed. It has been confirmed that the violet light emitting device obtained in the aforementioned manner exhibits high performance.

This violet light emitting device is absolutely similar in structure to Example 1 shown in FIG. 1 except that the light emitting layer 4 consists of $In_{0.2}Ga_{0.8}N$ which is doped with Mg, and hence a redundant description is omitted here.

When the partial pressure of TMIn was adjusted to be 20 times that of TMGa, a light emitting layer 4 consisting of $In_{0.5}Ga_{0.5}N$ doped with Mg was formed under the same conditions. Consequently, it was confirmed that a blue light emitting device of high performance was obtained.

When the partial pressure of TMIn was adjusted to be 50 times that of TMGa and the substrate temperature was adjusted in the range of 450° C. to 650° C., a light emitting layer 4 consisting of $In_{0.8}Ga_{0.2}N$ doped with Mg was formed under the same conditions. Consequently, it was confirmed that a green light emitting device of high performance was obtained.

(Example 5)

A compound semiconductor light emitting device was prepared similarly to Example 2, by employing Mg as a dopant for an InGaN layer in place of Si, S or Zn. At the time of growing a light emitting layer consisting of InGaN, TMGa, TMIn, HCl and $NH_3$ were introduced so that the partial pressure of TMIn was 20 times that of TMGa. Other preparation conditions were absolutely similar to those of Example 2, and hence a redundant description is omitted here.

Consequently, a blue light emitting device provided with a light emitting layer consisting of $In_{0.8}Ga_{0.5}N$ which was doped with Mg was completed. It has been confirmed that the blue light emitting device obtained in the aforementioned manner exhibits high performance.

When the partial pressure of TMIn was adjusted to be 50 times that of TMGa in the InGaN layer and the substrate temperature was adjusted in the range of 450° C. to 650° C., a light emitting layer 4 consisting of $In_{0.8}Ga_{0.2}N$ doped with Mg was formed under the same conditions. Consequently, it was confirmed that a green light emitting device of high performance was obtained.

According to the present invention, as hereinabove described, a compound semiconductor light emitting device of high performance can be readily prepared with a substrate of GaAs, GaP, InAs or InP at a low cost. In particular, band-edge emission can be implemented by Mg doping, whereby wide-ranging application to a laser diode etc. is enabled.

Further, the method according to the present invention is sufficiently applicable to industrial production.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of preparing compound semiconductor device, comprising the steps of:

placing into a reaction chamber a substrate of a compound semiconductor selected from the group consisting of GaAs, GaPL InAs and InP;

forming a buffer layer consisting of GaN on said substrate at a first temperature by introducing a first gas including an organic metal raw material containing hydrogen chloride and gallium and a second gas including ammonia into said reaction chamber while heating said reaction chamber overall from the exterior thereof for achieving said first temperature and carrying out vapor phase epitaxy on said substrate in said reaction chamber;

forming an epitaxial layer consisting of $Al_xGa_{1-x}N$ (0≦x<1) on said buffer layer at a second temperature that is higher than said first temperature by said introducing of said first gas and said second gas into said reaction chamber while heating said reaction chamber overall from the exterior thereof for achieving said second temperature and carrying out vapor phase epitaxy on said substrate in said reaction chamber;

forming a light emitting layer on said epitaxial layer; and forming a cladding layer on said light emitting layer.

2. The method of preparing a compound semiconductor device in accordance with claim 1, wherein said first temperature is in a range from 300° C. to 700° C., and said second temperature is at least 750° C.

3. The method of preparing a compound semiconductor device in accordance with claim 2, wherein said first temperature is in a range from 400° C. to 600° C.

4. The method of preparing a compound semiconductor device in accordance with claim 1, wherein said epitaxial layer consists of $Al_xGa_{1-x}N$ ($0 \leq x < 1$) having a first conductivity type, said light emitting layer at least substantially consists of $In_yGa_{y-1}N$ ($0 < y < 1$), and said cladding layer consists of $Al_zGa_{1-z}N$ ($0 \leq z < 1$) having a second conductivity type that is different from said first conductivity type.

5. The method of preparing a compound semiconductor device in accordance with claim 4, wherein said first temperature is in a range from 300° C. to 700° C., and said second temperature is at least 750° C.

6. The method of preparing a compound semiconductor device in accordance with claim 5, wherein said first temperature is in a range from 400° C. to 600° C.

7. The method of preparing a compound semiconductor device in accordance with claim 4, wherein said light emitting layer that at least substantially consists of $In_yGa_{1-y}N$ further includes Mg as a dopant.

8. The method of preparing a compound semiconductor device in accordance with claim 7, wherein said first temperature is in a range from 300° C. to 700° C., and said second temperature is at least 750° C.

9. The method of preparing a compound semiconductor device in accordance with claim 8, wherein said first temperature is in a range from 400° C to 600° C.

* * * * *

UNITED STATES PATENT AND TRADEMARK OFFICE
CERTIFICATE OF CORRECTION

PATENT NO. : 5,756,374
DATED     : May 26, 1998
INVENTOR(S) : Miura et al.

Page 1 of 2

It is certified that error appears in the above-identified patent and that said Letters Patent is hereby corrected as shown below:

Col. 1, line 54, after "zinc" replace "(zn)" by --(Zn)--.

Col. 2, line 15, before "and" replace "(TMGca)" by --(TMGa)--;
       line 28, after "VPE" replace "involve" by --involves--;
       line 29, after "and" replace "to introduce" by --introducing--;
       line 35, after "in" insert --the above cited--;
       line 38, after "by" delete "the".

Col. 4, line 2, after "of" replace "$0<y<0.4, 0.4<y<0.7, 0.7<y<0.9$ and $0.9<y<1$" by --$0<y<0.4, 0.4\leq y<0.7, 0.7\leq y<0.9$ and $0.9\leq y<1$--;
       line 64, before "such" replace "as" by --at--.

Col. 5, line 14, before "which" replace "$In_yGa_{k-y}N$ $(0<y<1)$" by --$In_yGa_{1-y}N$ $(0<y<1)$--.

Col. 6, line 30, before "substrate" replace "Gays" by --GaAs--;
       line 32, before "GaN" replace "in-type" by --n-type--.

Col. 7, line 4, before "GaN" replace "in-type" by --n-type--;
       line 10, before "GaN" replace "in-type" by --n-type--;
       line 16, before "GaN" replace "in-type" by --n-type--;
       line 25, after "of" replace "$Ino_{0.2}Ga_{0.8}N$" by --$In_{0.2}Ga_{0.8}N$--;
       line 28, before "GaN" replace "in-type" by --n-type--;
       line 31, before "GaN" replace "in-type" by --n-type--;
       line 33, before "InGaN" replace "in-type" by --n-type--;
       line 60, before "GaN" replace "in-type" by --n-type--.

UNITED STATES PATENT AND TRADEMARK OFFICE
CERTIFICATE OF CORRECTION

PATENT NO. : 5,756,374
DATED : May 26, 1998
INVENTOR(S) : Miura et al.

It is certified that error appears in the above-identified patent and that said Letters Patent is hereby corrected as shown below:

Col. 8, line 1, after "of" replace "in-type" by --n-type--;
line 16, before "AlGaN" replace "in-type" by --n-type--;
line 18, before "InGaN" replace "in-type" by --n-type--;
line 53, after "provided" replace "there between" by --therebetween--;

Col. 9, line 4, after "for" replace "there" by --then--;
line 28, before "increased" replace "and" by --are--.

Col. 10, line 17, after "of" replace "In$_{0.8}$Ga$_{0.5}$N" by --In$_{0.5}$Ga$_{0.5}$N--;
line 49, after "GaAs," replace "GaPL" by --GaP,--.

Signed and Sealed this

First Day of September, 1998

BRUCE LEHMAN

*Attest:*

*Attesting Officer*     *Commissioner of Patents and Trademarks*